United States Patent
Matsuura

(10) Patent No.: US 9,293,727 B2
(45) Date of Patent: Mar. 22, 2016

(54) ORGANIC ELECTROLUMINESCENCE DISPLAY DEVICE

(71) Applicant: SAMSUNG DISPLAY CO., LTD., Yongin, Gyeonggi-Do (KR)

(72) Inventor: Toshiyuki Matsuura, Yokohama (JP)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/582,298

(22) Filed: Dec. 24, 2014

(65) Prior Publication Data
US 2015/0179974 A1 Jun. 25, 2015

(30) Foreign Application Priority Data
Dec. 25, 2013 (JP) ................................. 2013-267376

(51) Int. Cl.
*H01L 51/52* (2006.01)
*H01L 51/50* (2006.01)

(52) U.S. Cl.
CPC ........ *H01L 51/5228* (2013.01); *H01L 51/5004* (2013.01); *H01L 51/5092* (2013.01); *H01L 2251/552* (2013.01)

(58) Field of Classification Search
CPC ............ H01L 51/5228; H01L 51/5004; H01L 2251/552

USPC ........................................................... 257/40
See application file for complete search history.

(56) References Cited

U.S. PATENT DOCUMENTS

| | | | |
|---|---|---|---|
| 6,088,011 A * | 7/2000 | Lee | H01J 17/497 345/60 |
| 7,221,095 B2 | 5/2007 | Yamazaki et al. | |
| 2012/0178933 A1* | 7/2012 | Kadoma | C07D 413/10 544/333 |

FOREIGN PATENT DOCUMENTS

| | | |
|---|---|---|
| JP | 2001-230086 A | 8/2001 |
| JP | 2005-011810 A | 1/2005 |
| JP | 2005-038833 A | 2/2005 |
| WO | WO 2011055496 A1 | 5/2011 |

* cited by examiner

*Primary Examiner* — Walter H Swanson
(74) *Attorney, Agent, or Firm* — Lee & Morse, P.C.

(57) ABSTRACT

An organic electroluminescence (EL) display device, includes a lower electrode on a substrate; an assistant electrode on the substrate and spaced apart from the lower electrode; an organic material layer on the lower electrode and the assistant electrode, the organic material layer including a light-emitting layer on the lower electrode; an upper electrode on the organic material layer; and a carrier generation material layer between the assistant electrode and the upper electrode, the organic material layer being between one or more of the carrier generation material layer and the assistant electrode, or the carrier generation material layer and the upper electrode.

6 Claims, 4 Drawing Sheets

ORGANIC ELECTROLUMINESCENCE DISPLAY DEVICE

CROSS-REFERENCE TO RELATED APPLICATION

Japanese Patent Application No. 2013-267376, filed on Dec. 25, 2013, in the Japanese Patent Office, and entitled: "Organic Electroluminescence Display Device," is incorporated by reference herein in its entirety.

BACKGROUND

1. Field

The present disclosure relates to an organic electroluminescence (EL) display device, for example, an EL display device including an assistant electrode.

2. Description of the Related Art

An organic electroluminescence (EL) display device using an organic EL element may have a relatively thin thickness and excellent color gamut as compared with a display device using a liquid crystal element. The organic EL display device may have a top emission structure to increase a density of pixels. In the top emission structure, light is output from a top surface (e.g., a front surface) of a thin film transistor (TFT) substrate.

SUMMARY

Embodiments may be realized by providing an organic electroluminescence (EL) display device, including a lower electrode on a substrate; an assistant electrode on the substrate and spaced apart from the lower electrode; an organic material layer on the lower electrode and the assistant electrode, the organic material layer including a light-emitting layer on the lower electrode; an upper electrode on the organic material layer; and a carrier generation material layer between the assistant electrode and the upper electrode, the organic material layer being between one or more of the carrier generation material layer and the assistant electrode, or the carrier generation material layer and the upper electrode.

The carrier generation material layer may include one or more of molybdenum (Mo), vanadium (V), indium (In), titanium (Ti), gold (Au), silver (Ag), zinc (Zn), or tin (Sn).

The carrier generation material layer may include an organic material having a lowermost unoccupied molecular orbital (LUMO) energy level equal to or less than −4.0 eV.

The carrier generation material layer may include a first organic material and a second organic material, the first organic material may have a lowermost unoccupied molecular orbital (LUMO) energy level equal to or less than −4.0 eV, the second organic material may have hole-conductivity, and a difference between the LUMO energy level of the first organic material and a highest occupied molecular orbital (HOMO) energy level of the second organic material may be ±1 eV.

The carrier generation material layer further may include one or more of lithium (Li), cesium (Cs), barium (Ba), magnesium (Mg), calcium (Ca), or aluminum (Al).

The carrier generation material layer may further include a stack layer having a lowermost unoccupied molecular orbital (LUMO) energy level equal to or less than −2 eV and equal to or greater than −3.5 eV.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
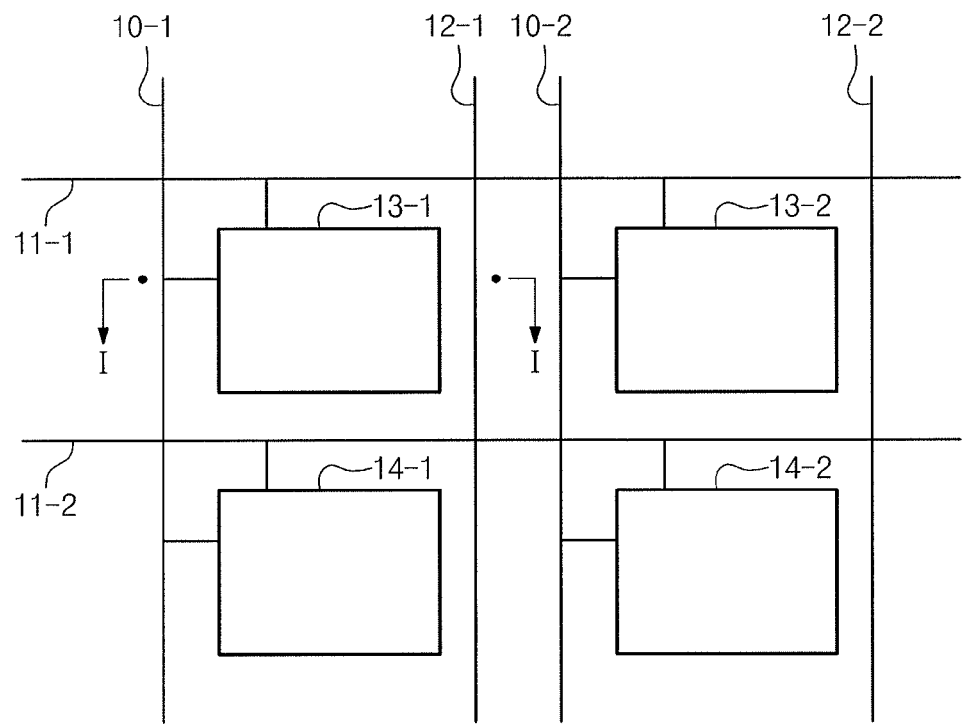
FIG. 1 illustrates a schematic plan view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing particular embodiments only and is not intended to be limiting. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of example embodiments.

It will be also understood that although the terms first, second, third, etc., may be used herein to describe various elements, these elements should not be limited by these terms. These terms are only used to distinguish one element from another element. Thus, a first element in some embodiments could be termed a second element in other embodiments. Exemplary embodiments explained and illustrated herein include their complementary counterparts. The same reference numerals or the same reference designators denote the same elements throughout the specification.

Moreover, exemplary embodiments are described herein with reference to cross-sectional illustrations and/or plan illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

First Embodiment

FIG. 1 illustrates a schematic plan view of a display device according to an embodiment. Pixels 13-1, 13-2, 14-1, and 14-2 may be arranged in a matrix form. Each of the pixels 13-1, 13-2, 14-1, and 14-2 may be disposed to correspond to a cross point of one of data lines 10-1 and 10-2 and one of gate lines 11-1 and 11-2. Each of the gate lines 11-1 and 11-2 may be connected to a switching element. For example, the gate lines 11-1 and 11-2 may be connected to gate electrodes of thin film transistors (TFTs). The TFTs may selectively supply data signals provided through the data lines 10-1 and 10-2 to organic electroluminescence (EL) elements of the pixels 13-1, 13-2, 14-1, and 14-2.

Assistant interconnections 12-1 and 12-2 may be disposed perpendicular to the gate lines 11-1 and 11-2. In an embodiment, the assistant interconnections 12-1 and 12-2 may be disposed perpendicular to the data lines 10-1 and 10-2.

Figure 2:
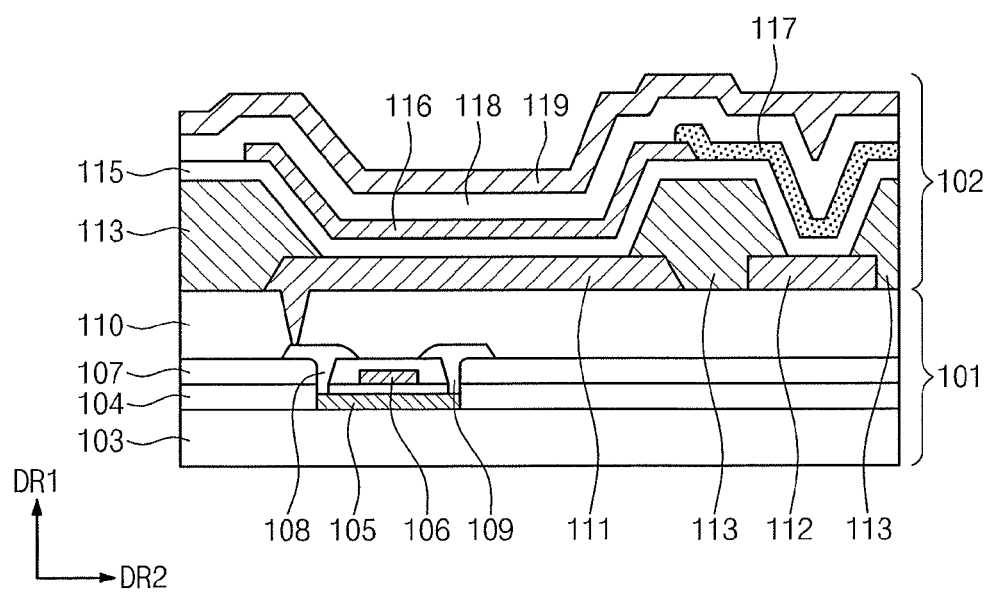
FIG. 2 illustrates a cross-sectional view of an organic electroluminescence (EL) element of a display device according to an embodiment.

FIG. 2 illustrates a cross-sectional view taken along a line I-I of FIG. 1. FIG. 2 mainly illustrates an organic EL element of a display device according to an embodiment. The organic EL element may be a layer 102 that is formed on a substrate 101.

In FIG. 2, the substrate 101 may include a base substrate 103, and first and second insulating layers 104 and 107 disposed at a position at which a switching element of the TFT is formed.

A semiconductor layer 104 may be disposed on the base substrate 103, and the first insulating layer 104 may cover the semiconductor layer 105. A gate electrode 106 may be disposed on the first insulating layer 104. The first insulating layer 104 may be a barrier layer. In an embodiment, the substrate 101 may further include a barrier layer. The second insulating layer 107 may be disposed on the first insulating layer 104 to surround the switching element. A planarization layer 110 may be disposed on the second insulating layer 107. An electrode 109 connected to the data line and an electrode 108 connected to the organic EL element may be connected to the semiconductor layer 105 through contact holes penetrating the second and first insulating layers 107 and 104, respectively.

A lower electrode 111, which is connected to the electrode 108, may be disposed on the substrate 101. An assistant electrode 112, which is connected to the assistant interconnection, may be disposed on the substrate 101. The assistant electrode 112 may be spaced apart from the lower electrode 111, e.g., in a direction orthogonal to a thickness of the electrodes along a first direction. A pixel isolation insulating layer 113 surrounding the lower and assistant electrodes 111 and 112 may be disposed on the substrate 101. A portion of the lower electrode 111, which is not covered by the pixel isolation insulating layer 113, may correspond to an opening of the pixel. In the present embodiment, the lower electrode 111, the assistant electrode 112, and the pixel isolation insulating layer 113 may be disposed on the planarization layer 110.

A first organic material layer 115 may be formed on at least the lower electrode 111. In FIG. 2, the first organic material layer 115 covers the lower electrode 111, the assistant electrode 112, and the pixel isolation insulating layer 113. A portion of the first organic material layer 115 may be disposed on the lower electrode 111, and another portion of the first organic material layer 115 may be disposed on the assistant electrode 112.

The lower electrode 111 may be an anode electrode, and the first organic material layer 115 may include a material that transports holes to a light-emitting layer 116 that will be described later. For example, the first organic material layer 115 may include N,N'-di(1-naphthyl)-N,N'-diphenylbenzidine (NPB). The first organic material layer 115 may include a plurality of materials used as the material transporting the holes and may have a multi-layered structure that includes a plurality stacked layers respectively formed of the materials.

The light-emitting layer 116 may be formed on the first organic material layer 115. The light-emitting layer 116 may determine a color of light emitted from the organic EL element. The light-emitting layer 116 may be disposed on the lower electrode 111 with the first organic material layer 115 interposed therebetween. The light-emitting layer 116 may be combined with the first organic material layer 115 and a second organic material layer 118 to be described later, thereby emitting light.

A carrier generation material layer 117 formed of a carrier generation material may be disposed on the assistant electrode 112. The carrier generation material is a material capable of generating carriers (holes and/or electrons). For example, the carrier generation material may include $MoO_3$, a compound of $MoO_3$ and Mg, $V_2O_5$, 1,4,5,8,9,12-hexaazatriphenylenehexacarbonitrile (HAT-CN), or a compound of Al and LiF.

In FIG. 2, a portion of the light-emitting layer 116 overlaps with a portion of the carrier generation material layer 117. In other embodiments, the light-emitting layer 116 may be spaced apart from the carrier generation material layer 117, e.g., in a direction orthogonal to a thickness of the layers along a first direction.

In FIG. 2, the first organic material layer 115 is disposed between the carrier generation material layer 117 and the assistant electrode 112. In other embodiments, the carrier generation material layer 117 may be in direct contact with the assistant electrode 112.

The second organic material layer 118 may be formed on the light-emitting layer 116 and the carrier generation material layer 117. The lower electrode 111 may be the anode electrode as described above, and the second organic material layer 118 may include a material that transports electrons to the light-emitting layer 116. The second organic material layer 118 may have a multi-layered structure including the electron transport material and an electron injection material.

In FIG. 2, the second organic material layer 118 covers the light-emitting layer 116, the carrier generation material layer 117, and the first organic material layer 115. A portion of the second organic material layer 118 covers the carrier generation material layer 117. According to embodiments, the second organic material layer 118 may be disposed on only the light-emitting layer 116. The second organic material layer 118 may not be disposed on or under the carrier generation material layer 117. In other embodiments, the carrier generation layer 117 may be in direct contact with at least one of the first organic material layer 115 and the second organic material layer 118.

An upper electrode 119 may be formed on the second organic material layer 118. The organic EL element may be a top emission type, and the upper electrode 119 may include a material that transmits the light generated from the light-emitting layer 116. For example, the upper electrode 119 may include indium-tin oxide (ITO).

The first organic material layer 115 and the second organic material layer may be defined as an organic material layer being in one-united body, and the organic material layer may further include the light-emitting layer 116 formed on the lower electrode 111. The organic material layer may also be formed on the assistant electrode 112. The carrier generation material layer 117 may be formed through a portion of the organic material layer so as to be disposed the assistant electrode 112 and the upper electrode 119.

In the embodiment described above, the carrier generation material layer 117 may be disposed between the assistant electrode 112 and the upper electrode 119. The carrier generation material layer 117 may be in contact with at least one of the first and second organic material layers 115 and 118 of the organic material layer including the light-emitting layer 116 therein. One or both of the first organic material layer 115 and the second organic material layer 118 may be disposed between the carrier generation material layer 117 and the assistant electrode 112 and/or between the carrier generation material layer 117 and the upper electrode 119. In some embodiments, a cross-sectional structure on the planarization layer 110 may have a structure (a first structure) including the assistant structure 112, the first organic material layer 115, the carrier generation material layer 117, the second organic material layer 118, and the upper electrode 119 which are sequentially stacked. In other embodiments, the cross-sectional structure on the planarization layer 110 may have a structure (a second structure) including the assistant structure 112, the carrier generation material layer 117, the second organic material layer 118, and the upper electrode 119 which are sequentially stacked. In still other embodiments, the cross-sectional structure on the planarization layer 110 may have a structure (a third structure) including the assistant structure 112, the first organic material layer 115, the carrier generation material layer 117, and the upper electrode 119 which are sequentially stacked. In yet other embodiments, the cross-sectional structure on the planarization layer 110 may have a structure (a fourth structure) including the assistant structure 112, the second organic material layer 118, the carrier generation material layer 117, and the upper electrode 119 which are sequentially stacked. In yet still other embodiments, the cross-sectional structure on the planarization layer 110 may have a structure (a fifth structure) including the assistant structure 112, the carrier generation material layer 117, the first organic material layer 115, and the upper electrode 119 which are sequentially stacked. As a result, the assistant electrode 112 may be electrically connected to the upper electrode 119 by the carriers generated in the carrier generation material layer 117. A common voltage or a ground (VSS) voltage may be applied to the assistant electrode 112. Voltages required for other operations of the organic EL element may be applied to the assistant electrode 112.

The first organic material layer 115 and the second organic material layer 118 may be electrically insulating. In a comparative example, a contact may be formed to electrically connect the assistant electrode 112 to the upper electrode 119 (by the laser ablation). In another comparative example, an assistant interconnection may be formed on the first organic material layer 115.

According to embodiments, the carrier generation material layer 117 may be formed between the processes of forming the first organic material layer 115, the second organic material layer 118, and the light-emitting layer 116, and the structure electrically connecting the assistant electrode 112 to the upper electrode 119 may be formed without an increase in the number of processes and reduction of a yield.

Second Embodiment

A method of fabricating an organic EL element according to an embodiment will be described hereinafter.

Figure 3A:
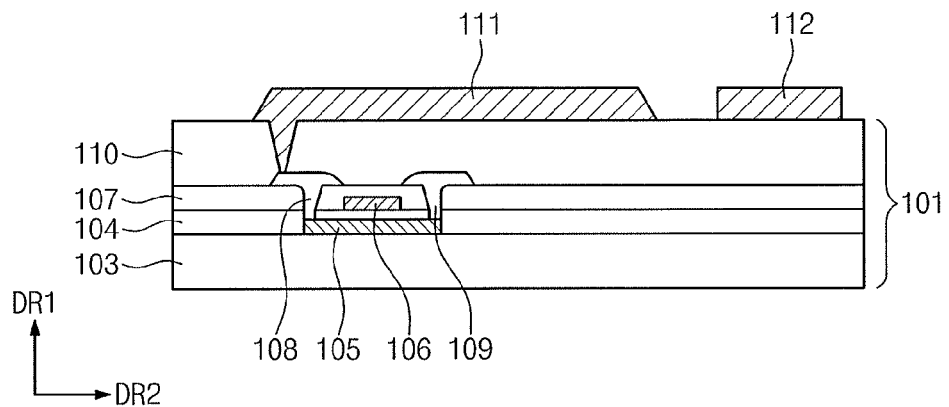
FIG. 3A illustrates a cross-sectional view of a method of fabricating an organic EL element of a display device according to an embodiment.

Referring to FIG. 3A, the substrate 101 of a top emission-type organic EL display device having a pixel pitch of, for example, 318 μm may be formed using a low-temperature poly-silicon TFT. A through-hole may be formed to connect the TFT to the lower electrode 111, and the rest portion except the through-hole may correspond to the planarization layer 110. The planarization layer 110 may be formed of, for example, polyimide and may have a thickness of, for example, 2 μm, e.g., in a first direction. The lower electrode 111 and the assistant electrode 112 may be formed to be spaced apart from each other on the substrate 101, e.g., in a second direction orthogonal to the first direction. For example, each of the lower electrode 111 and the assistant electrode 112 may be formed of an electrode layer including an silver alloy (thickness: 150 nm, e.g., in the first direction) and an ITO layer (thickness: 20 nm, e.g., in the first direction) which are stacked. The lower electrode 111 and the assistant electrode 112 may be formed by patterning the same electrode layer.

Figure 3B:
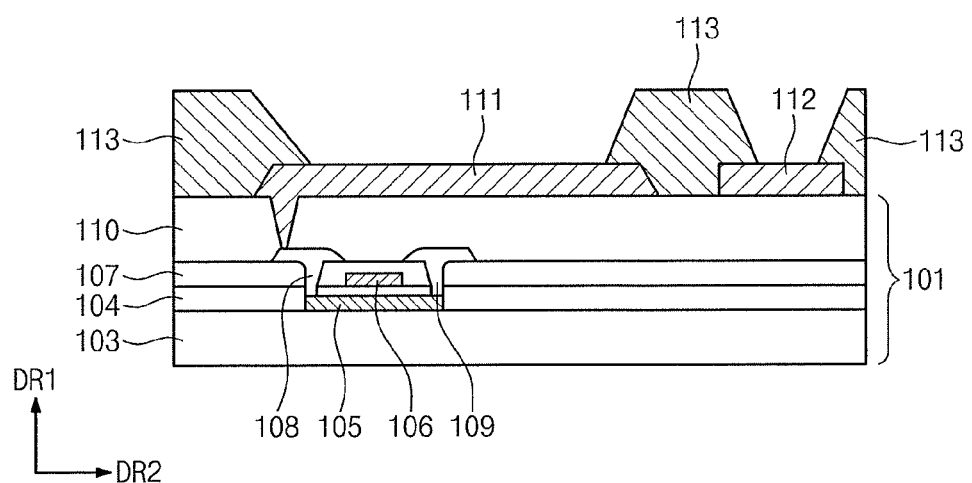
FIG. 3B illustrates a cross-sectional view of a method of fabricating an organic EL element of a display device according to an embodiment.

Next, as illustrated in FIG. 3B, an insulating layer 113 may be formed. The insulating layer 113 may not overlap with a portion of the lower electrode 111. The opening of the pixel (hereinafter, referred to as "a pixel opening") may be defined on the portion of the lower electrode 111 not overlapping with the insulating layer 113. The insulating layer 113 may not overlap with a portion of the assistant electrode 112. A connection opening for electrically connecting the assistant electrode 112 to the upper electrode may be defined on the portion of the assistant electrode 112 not overlapping with the insulating layer 113. In some embodiments, one connection opening of the assistant electrode 112 and the upper electrode may be formed in one pixel. In other embodiments, the connection opening of the assistant electrode 112 and the upper electrode may be provided in plurality in one pixel. In still other embodiments, the connection opening of the assistant electrode 112 and the upper electrode may not be formed in one or some of the pixels.

Figure 4A:
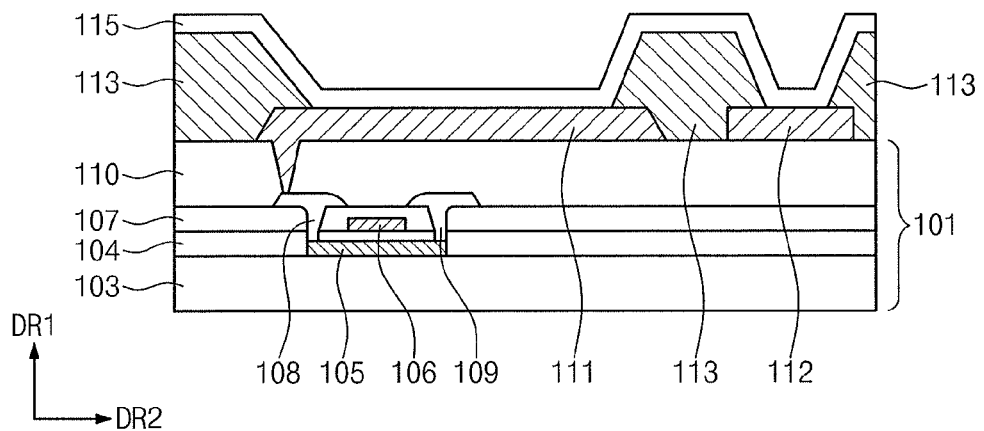
FIG. 4A illustrates a cross-sectional view of a method of fabricating an organic EL element of a display device according to an embodiment.

An oxygen plasma treatment process may be performed on the substrate 101 fabricated above as necessary. Thereafter, as illustrated in FIG. 4A, the first organic material layer 115 may be formed in the pixel opening by stacking, for example, 4,4',4''-tris(3-methylphenylamino)triphenylamine (m-MT-DATA; thickness: 50 nm) and N,N'-di(1-naphthyl)-N,N'-diphenylbenzidine (NPB; thickness: 70 nm) by a vacuum deposition method. At this time, the first organic material layer 115 may cover an entire effective screen of the display device. For example, the first organic material layer 115 may cover the lower electrode 111 and the assistant electrode 112. A conductive pad of the assistant interconnection connected to the assistant electrode 112 and a connection portion between a cathode of the TFT and the upper electrode may not be covered with the first organic material layer 115 by an area mask. In subsequent processes, the conductive pad and the connection portion may not be covered with other layers.

Figure 4B:
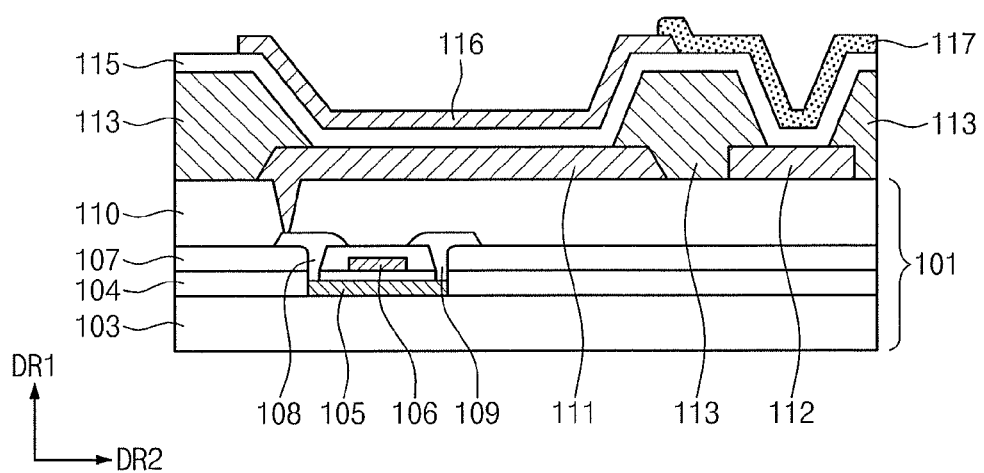
FIG. 4B illustrates a cross-sectional view of a method of fabricating an organic EL element of a display device according to an embodiment.

Next, as illustrated in FIG. 4B, the light-emitting layer 116 may be formed in the pixel opening. The light-emitting layer 116 may be formed using, for example, a vacuum deposition method. A forming rate of 9,10-di(2-naphthyl)anthracene (ADN) and a forming rate of tetra phenyl butadiene (TPB) may be controlled such that a ratio of TPB to ADN becomes 3 volume %. The light-emitting layer 116 may have a thickness of 30 nm. The carrier generation material layer 117 including a $MoO_3$ layer and a magnesium (Mg) layer may be formed in the connection opening of the assistant electrode 112 and the upper electrode by a vacuum deposition method. The $MoO_3$ layer may have a thickness of, for example, 10 nm, and the Mg layer may have a thickness of, for example, 20 nm. The carrier generation material layer 117 may be stacked on the assistant electrode 112.

Figure 5A:
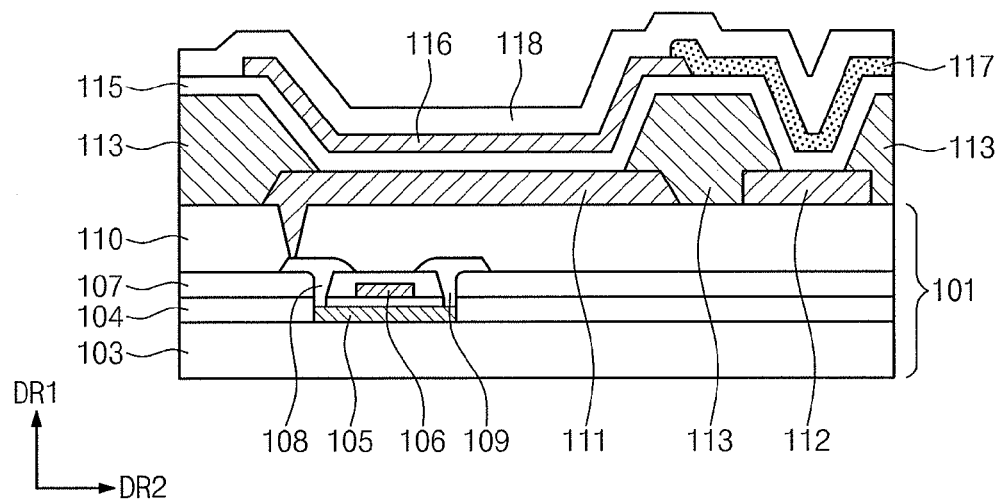
FIG. 5A illustrates a cross-sectional view of a method of fabricating an organic EL element of a display device according to an embodiment.
Figure 5B:
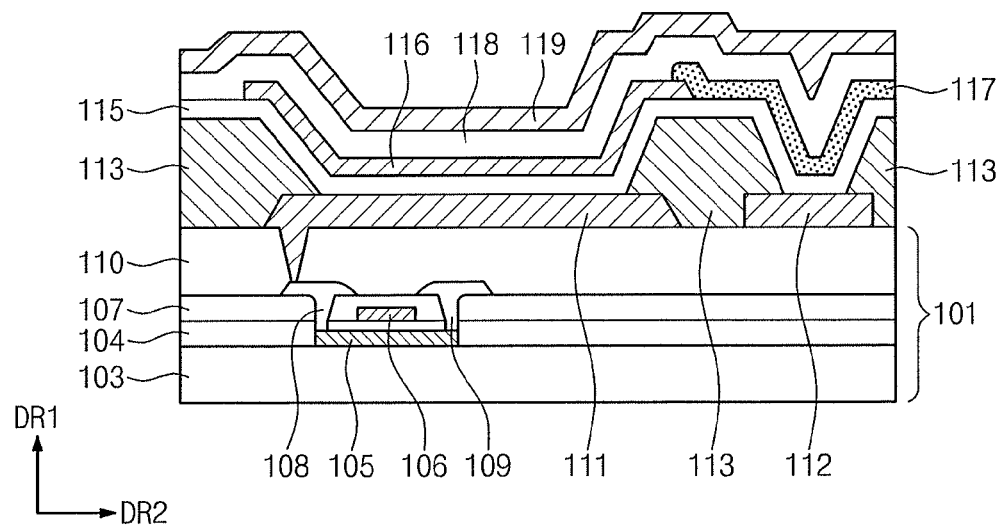
FIG. 5B illustrates a cross-sectional view of a method of fabricating an organic EL element of a display device according to an embodiment.

Subsequently, as illustrated in FIG. 5A, the second organic material layer 118 may be formed by a vacuum deposition method. For example, the second organic material layer 118 may be formed of tris-(8-hydroxyquinolinato aluminum (Alq3) and may have a thickness of 30 nm. As illustrated in FIG. 5B, the upper electrode 119 may be formed by a vacuum deposition method. For example, the upper electrode 119 may be formed of a compound of magnesium and silver. For example, a ratio of magnesium to silver may be 10:1 in the upper electrode 119. The compound of magnesium and silver may have a thickness of, for example, 12 nm.

Next, the substrate 101 may be sealed using a transparent sealing glass and an ultraviolet-curable resin under a nitrogen atmosphere.

Experimental Embodiment 1

An organic EL display device including 100 pixels (10×10) arranged at a pixel pitch of 318 μm was fabricated using the material and thickness conditions described in the fabrication method of the second embodiment. The organic EL display device had a light-emitting efficiency of 4.5 cd/A and a driving voltage of 10.05 V at a current of 3 mA.

Experimental Embodiment 2

An organic EL display device including 100 pixels (10×10) arranged at a pixel pitch of 318 μm was fabricated using a $V_2O_5$ layer of 7 nm instead of the $MnO_3$ layer of 10 nm described in the fabrication method of the second embodiment. Other fabrication conditions of the present experimental embodiment were the same as corresponding conditions of the second embodiment described above. The organic EL display device had a light-emitting efficiency of 4.5 cd/A and a driving voltage of 10.05 V at a current of 3 mA.

Experimental Embodiment 3

An organic EL display device including 100 pixels (10×10) arranged at a pixel pitch of 318 μm was fabricated using a 1,4,5,8,9,12-hexaazatriphenylenehexacarbonitrile (HAT-CN) layer of 5 nm instead of the $MnO_3$ layer of 10 nm described in the fabrication method of the second embodiment. Other fabrication conditions of the present experimental embodiment were the same as corresponding conditions of the second embodiment described above. The organic EL display device had a light-emitting efficiency of 4.5 cd/A and a driving voltage of 10.05 V at a current of 3 mA.

Experimental Embodiment 4

An organic EL display device including 100 pixels (10×10) arranged at a pixel pitch of 318 μm was fabricated using an Al layer of 10 nm and a LiF layer of 0.5 nm instead of the Mg layer of 20 nm described in the fabrication method of the second embodiment. Other fabrication conditions of the present experimental embodiment were the same as corresponding conditions of the second embodiment described above. The organic EL display device had a light-emitting efficiency of 5 cd/A and a driving voltage of 10.05 V at a current of 3 mA.

Experimental Embodiment 5

An organic EL display device including 100 pixels (10×10) arranged at a pixel pitch of 318 μm was fabricated using an ITO layer of 20 nm instead of the MnO₃ layer described in the fabrication method of the second embodiment. Other fabrication conditions of the present experimental embodiment were the same as corresponding conditions of the second embodiment described above. The organic EL display device had a light-emitting efficiency of 5 cd/A and a driving voltage of 10.05 V at a current of 3 mA.

Comparison Example 1

In an organic EL display device according to the present comparison example 1, the carrier generation material layer 117 of the MoO₃ layer described in the second embodiment was not formed, and some materials were patterned to directly connect the upper electrode 118 to the assistant electrode 112. The organic EL display device fabricated according to the present comparison example 1 included 100 pixels (10×10) arranged at a pixel pitch of 318 μm. The organic EL display device had a light-emitting efficiency of 4.5 cd/A and a driving voltage of 10.05 V at a current of 3 mA.

Comparison Example 2

The carrier generation material layer 117 of the MoO₃ layer described in the second embodiment was not formed in an organic EL display device according to the present comparison example 2. The organic EL display device fabricated according to the present comparison example 2 included 100 pixels (10×10) arranged at a pixel pitch of 318 μm. In the organic EL display device, even though a current and a voltage were applied to the lower electrode 111 and the assistant electrode 112, a current did not flow through the pixel and light was not emitted.

Evaluation of Experimental Embodiments and Comparison Examples

As described above, the presently disclosed organic EL display devices may have equivalent, e.g., substantially the same, light-emitting efficiency as an organic EL display device including an upper electrode and an assistant electrode which are in direct contact with each other.

Third Embodiment

In any one of the first and second embodiments, the carrier generation material layer 117 may include a material including one or more of molybdenum (Mo), vanadium (V), indium (In), titanium (Ti), gold (Au), silver (Ag), zinc (Zn), or tin (Sn). In an embodiment, the material of the carrier generation material layer 117 may be a compound. For example, the carrier generation material layer 117 may include a compound including one or more of molybdenum (Mo), vanadium (V), indium (In), titanium (Ti), gold (Au), silver (Ag), zinc (Zn), or tin (Sn).

According to other embodiments, in any one of the first and second embodiments, the carrier generation material layer 117 may include an organic material having a lowermost unoccupied molecular orbital (LUMO) energy level equal to or less than −4.0 eV, for example, −4.5 eV.

According to still other embodiments, in any one of the first and second embodiments, the carrier generation material layer 117 may include a mixture of a first organic material and a second organic material. The first organic material has a LUMO energy level equal to or less than −4.0 eV. The second organic material has hole-conductivity and a highest occupied molecular orbital (HOMO) energy level. A difference between the LUMO energy level of the first organic material and the HOMO energy level of the second organic material may be ±1 eV.

According to yet other embodiments, the carrier generation material layer 117 may include or further include a material including one or more of lithium (Li), cesium (Cs), barium (Ba), magnesium (Mg), calcium (Ca), or aluminum (Al). In an embodiment, the material of the carrier generation material layer 117 may be a compound. For example, the carrier generation material layer may include a compound including one or more of lithium (Li), cesium (Cs), barium (Ba), magnesium (Mg), calcium (Ca), or aluminum (Al).

According to yet still other embodiments, the carrier generation material layer 117 may further include a stack layer having a LUMO energy level equal to or less than −2 eV and equal to or greater than −3.5 eV.

By way of summation and review, an upper electrode may be disposed on an organic EL layer of an organic EL display device having a top emission structure. The upper electrode may transmit light. A material capable of transmitting light may have a high electric resistance and may cause a potential gradient, and an image displayed on the organic EL display device may be deteriorated. An assistant electrode may be used to reduce or suppress a potential gradient.

For example, a low-resistance wire for an assistant electrode disposed on an organic EL layer may be patterned. It may be difficult to pattern the low-resistance wire on the organic EL layer, it may be difficult to increase a size and a pixel density of a display device, and fabrication yield of the display device may be reduced.

A contact connecting an assistant electrode to an upper electrode may be formed by laser ablation. A position at which laser may be irradiated should be accurately controlled to perform the laser ablation. A material evaporated by the laser ablation may be re-deposited, a sealing process using silicon nitride (SiN) may be disturbed by the re-deposited material, and light extraction performance may be deteriorated.

Embodiments may provide an organic EL display device including an assistant electrode and an upper electrode stably connected to each other.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic electroluminescence (EL) display device, comprising:
   a lower electrode on a substrate;
   an assistant electrode on the substrate and spaced apart from the lower electrode;
   an organic material layer on the lower electrode and the assistant electrode, the organic material layer including a light-emitting layer on the lower electrode;
   an upper electrode on the organic material layer; and
   a carrier generation material layer between the assistant electrode and the upper electrode, the organic material layer being between one or more of:
   the carrier generation material layer and the assistant electrode, or
   the carrier generation material layer and the upper electrode.

2. The organic EL display device as claimed in claim 1, wherein the carrier generation material layer includes one or more of molybdenum (Mo), vanadium (V), indium (In), titanium (Ti), gold (Au), silver (Ag), zinc (Zn), or tin (Sn).

3. The organic EL display device as claimed in claim 2, wherein the carrier generation material layer further includes one or more of lithium (Li), cesium (Cs), barium (Ba), magnesium (Mg), calcium (Ca), or aluminum (Al).

4. The organic EL display device as claimed in claim 1, wherein
   the carrier generation material layer includes a first organic material and a second organic material.

5. The organic EL display device as claimed in claim 1, wherein the carrier generation material layer further includes a stack layer having a lowermost unoccupied molecular orbital (LUMO) energy level equal to or greater than $-3.5$ eV and equal to or less than $-2$ eV.

6. The organic EL display device as claimed in claim 4, wherein:
   the second organic material has hole-conductivity, and
   a difference between a lowermost unoccupied molecular orbital (LUMO) energy level of the first organic material and a highest occupied molecular orbital (HOMO) energy level of the second organic material is $\pm 1$ eV.

* * * * *